(12) United States Patent
Davies

(10) Patent No.: US 7,710,292 B2
(45) Date of Patent: May 4, 2010

(54) SYSTEM AND METHOD FOR IMPROVED DATA ENTRY

(76) Inventor: Jeffrey John Davies, 6201 Rein St., Raleigh, NC (US) 27613

( * ) Notice: Subject to any disclaimer, the term of this patent is extended or adjusted under 35 U.S.C. 154(b) by 363 days.

(21) Appl. No.: 11/531,124

(22) Filed: Sep. 12, 2006

(65) Prior Publication Data
US 2007/0057822 A1    Mar. 15, 2007

Related U.S. Application Data

(60) Provisional application No. 60/716,235, filed on Sep. 12, 2005.

(51) Int. Cl.
*H03M 11/00*    (2006.01)
(52) U.S. Cl. .................. 341/22; 345/168; 345/173; 341/20; 341/23
(58) Field of Classification Search .......... 341/20, 341/22, 23; 345/168, 173
See application file for complete search history.

(56) References Cited

U.S. PATENT DOCUMENTS

| | | | | |
|---|---|---|---|---|
| 5,128,672 | A | * | 7/1992 | Kaehler ............... 341/23 |
| 6,528,741 | B2 | | 3/2003 | Walker |
| 6,639,586 | B2 | * | 10/2003 | Gerpheide ............. 345/173 |
| 6,765,556 | B2 | | 7/2004 | Kandogan et al. |
| 6,782,280 | B1 | | 8/2004 | McKay |
| 7,002,553 | B2 | * | 2/2006 | Shkolnikov ............ 345/169 |
| 7,218,249 | B2 | * | 5/2007 | Chadha ............... 341/23 |

* cited by examiner

*Primary Examiner*—Albert K Wong
(74) *Attorney, Agent, or Firm*—Romi Bose (57) ABSTRACT

A system and method for entering text via a numeric keypad. The keypad is logically divided into columns, with each column having four rows. The first column includes at least the keypad number associated with a particular key, the second column includes the lowercase letters associated with the key and the third column contains the shifted versions of the characters in the second column.

20 Claims, 6 Drawing Sheets

SYSTEM AND METHOD FOR IMPROVED DATA ENTRY

This application is a continuation of U.S. patent application Ser. No. 60/716,235, filed on Sep. 12, 2005.

BACKGROUND

The present invention relates generally to a data entry systems and, more particularly, to a data entry system based on a limited number of input keys.

For many years, 12-key keypads (FIG. 1) have been used in a variety of applications. In fact, such keypads have been made ubiquitous through their availability and implementation in devices as far ranging as automatic teller machines (ATMs) to point of sales (POS) terminals. In fact, as technology has progress, ATMs have reached a degree of functionality that they are used in a multitude of ways other than for dispensing money.

Even more commonly, 12-key keypads have been fixtures of touch-tones telephones from their very inception. Naturally, the same keypads are used in telephones of all kinds, including cordless and cellular telephones. More recently, as cellular phones have increased in popularity, they have also become more multifunctional. These devices are now called upon to perform functions traditionally associated with Personal Digital Assistants (PDAs), including the ability of the user to enter data or text for storage or for sending as a message. Instant messaging, which requires interactive communication with others, has exploded in popularity as a cell phone application. The ability to enter data quickly and easily is a very important aspect of usability of these devices.

Text or data entry systems, as described above, are typically implemented in at least two different ways. In one method, a multiple tap system is a way of using the conventional keypad of a telephone to write text. The multi-tap method requires the user to press the '2' through '9' keys for writing letters, the '1' and '0' keys for entering symbols and punctuation, and, optionally, the '*' and '#' keys for moving the cursor to the left and right.

For any of the alphabet letters, the user is required to press the 2 through 9 keys to scroll through the letters and number choices associated with that key. For example, the 2 key on most telephones and cellular phones have printed on them the letters 'a', 'b' and 'c'. When the 2 key is pressed once, the character 'a' is displayed. The second press of the same key displays the character 'b', the third press of the key displays the character 'c' and the fourth press of the key displays the number '2'. Subsequent key presses of the '2' key recycle the above sequence. The other keys work in a similar manner.

In another type of text entry system, pressing a number indicates the particular bank of letters being selected. For example, pressing 2 selects the bank of letters 'ABC'. Then pressing 1, 2 or 3 indicates whether A, B or C is to be entered. To effect a change in case of the letter, additional key presses are required.

In still other systems, such as those available from Tegic Communications, Inc. and Motorola, Inc., predictive text entry systems based upon dictionary lookups are provided. In such systems, words or even entire sentences may be predicted. A user presses the numbers associated with the letters of a word and an internal database is scanned to determine the intended word.

Each of the above systems has its own disadvantages. In the multi-tap method, an inordinately large number of key presses are required to create a word. For example, the word 'call' requires ten key presses. In the predictive text entry systems, the user must look down at the screen to ensure that the proper word or sentence has been predicted correctly. If not, manual intervention is required to select the correct choice from among several. Unfortunately, this can be cumbersome and distracting since the user must look at the screen and make corrections through additional key presses.

DESCRIPTION

In order to provide a more convenient and user-friendly data or text entry system, there is provided a system and method for entering text or data via a numeric keypad that eliminates the need to look at the keypad or screen and requires relatively few keystrokes to input characters and words.

For example, ATM machines are frequently used for more than simply dispensing money. They also may be used to purchase tickets, dispense coupons, provide directions, etc. In order to do so, the user is required to enter data through 12-key keypad. Such data may include names, addresses, destinations and other pertinent information. POS terminals also may be used for such things, or may be used by a cashier to enter notes onto a printed receipt. In either instance, a relatively large amount of text must be entered using the 12-key keypad. The present data entry system enables the user to enter such data quickly and easily. In addition, the present data entry method may be used in remote controls for multimedia components or systems, such as digital video recorders. In many cases, text or data must be entered via the numeric or 12-key keypad.

A particular advantage of the present text entry method is that no more than two key presses are required to enter any single number or letter. For example, the word "call" requires only eight key presses versus the ten of the multi-tap system. Another advantage is that the user does not have to look at the screen to determine whether the correct word or character is being entered. Still another advantage of the present system is that because a database lookup system is not used, processing power and memory usage is conserved.

Figure 1:
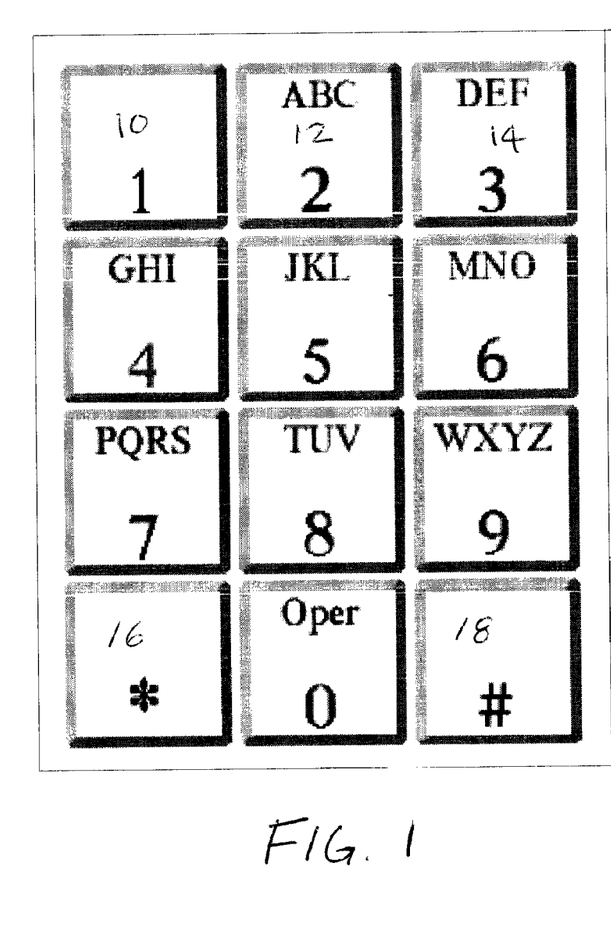
FIG. 1 illustrates an exemplary numeric keypad commonly found on cellular and landline based telephones in accordance with the instant data entry system.

FIG. 1 illustrates a standard 12-key keypad such as used, for example, in telephone or cellular telephones, which is compatible with the present data entry system. The '1' key 10 typically includes only the number itself, but in cellular telephone applications is labeled with a plurality of symbols, the '2' key 12 includes letters 'a', 'b' and 'c', the '3' key 14 includes letters 'd', 'e' and 'f' and so on. The '*' and the '#' keys 16, 18 may be assigned special functions that may vary depending on the particular programming of the phone.

It is to be noted that, advantageously, the keypad of the present system includes a standard keypad that does not require any kind of initial preconfiguration. This eliminates the need for a user to be trained in initial use of the keypad.

As will be discussed in greater detail below, depending on the specific hardware implementation of the keypad, the new alternate key mappings may be presented in one of several visual ways. Alternatively, to reduce costs and to enable the present system to be used in existing keypads, alternative key mappings may not be shown at all. Because of the ease of use and intuitive nature of the present data entry system, a user should require very little training to become familiar with and to effectively use the present system with no visual cues.

In the present data entry system, a logical grouping of characters is tied to a specific key on the keypad. The keypad itself is then logically divided up by columns, with each column having four rows apiece. In an exemplary embodiment, the first column in the first row is the keypad number. The second row is the shifted number, as one would find on a standard typewriter or computer keyboard. The third row is a space for an extra character and the '*' key is in the fourth row. In every group, pressing * aborts the operation and returns the user back to the starting state. Note however, although used in the various exemplary embodiments in the discussion of the present data entry system, the '*' key may be assigned a different function as preferred by the user or the system provider. In that case, a different key may be used to abort the operation. For example, in cellular telephones, there is a specific key, that once pressed, return the user to the main screen. A similar system may be used in the present data entry system.

Next, the second column is configured as the "home" column, and contains the most common characters, which are typically the lowercase letters. Finally, the third column contains the shifted versions of the characters in the second column. In operation, the first key press defines the character group and the second key press actually selects the desired character. As can be seen, the layout is very intuitive and requires little training to learn. In addition, depending on user preference or usability studies, the columns may be rearranged. For example, the "home" column may be used to show the shifted characters and column three may contain the most common characters.

Figure 2:
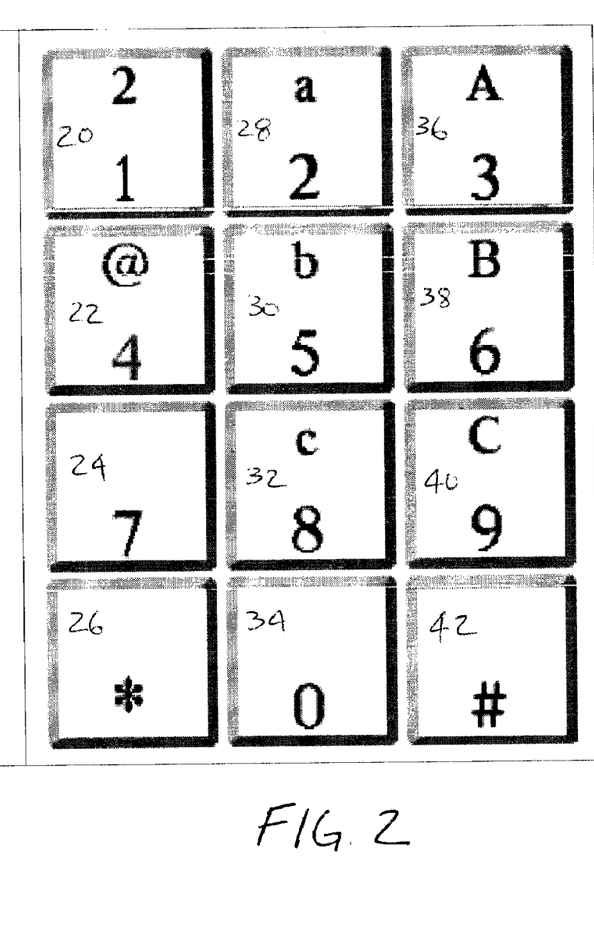
FIG. 2 illustrates an exemplary new keymapping of the keypad of FIG. 1 upon pressing the '2' key in accordance with the instant data entry system.

Turning now to FIG. 2, an exemplary keypad mapping system is illustrated for when a user presses '2' on the keypad. In the first column, the first row 20 of the keypad is mapped to the number 2. The second row 22 is mapped with the symbol associated with the shifted number 2, which is the '@' symbol. The third row key 24 remains blank and operates as a no-action or null key or it may be reserved for an additional symbol. The fourth and final row 26 includes the * symbol for aborting the operation and returning to the last state.

The second column includes the lower case form of the letters associated with the letters corresponding to the keypad number, which in this example includes the letters a, b and c. For example, the first row 28 of the column is mapped with the lower case letter 'a'. The second row 30 is mapped to lower case 'b' and the third row 32 is mapped to lower case 'c'. The fourth row 34 is mapped to any letter or symbol the manufacturer requires or is left as a no-action or null key.

The third column includes the upper case letters associated with the letters corresponding to the keypad number, which includes the letters A, B and C. Accordingly, the first row 36 of the column is mapped with the upper case letter 'A'. The second row 38 is mapped to upper case 'B' and the third row 40 is mapped to upper case 'C'. The fourth row 42, once again, is mapped to any letter or symbol, or is left as a no-action or null key.

Figure 3:
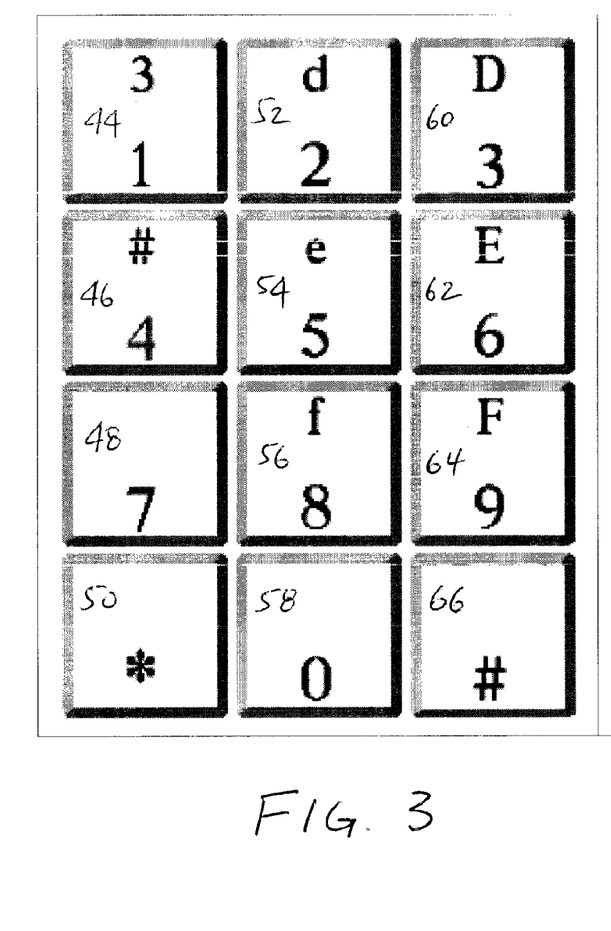
FIG. 3 illustrates an exemplary new keymapping of the keypad of FIG. 1 upon pressing the '3' key in accordance with the instant data entry system.

FIG. 3 illustrates the exemplary keypad mapping system when '3' is pressed on the keypad. In the first column, the first row 44 of the keypad is mapped to number 3. The second row 46 is mapped with the symbol associated with shifted number 3, which is the '#' symbol. The third row key 48 remains blank and operates as a no-action or null key or it may be reserved for an additional symbol. The fourth row 50 includes the * symbol.

The second column includes the lower case form of the letters associated with the letters corresponding to the keypad number, which in this example includes the letters d, e and f. For example, the first row 52 of the column is mapped with the lower case 'd'. The second row 54 is mapped to lower case 'e' and the third row 56 is mapped to lower case 'f'. The fourth row 58 is mapped to any letter or symbol the manufacturer requires or is left as a no-action or null key.

The third column includes the upper case letters associated with the letters corresponding to the keypad number, which includes the letters D, E and F. Accordingly, the first row 60 of the column is mapped with the upper case letter 'D'. The second row 62 is mapped to upper case 'E' and the third row 64 is mapped to upper case 'F'. The fourth row 66, once again, is mapped to any letter or symbol, or is left as a no-action or null key.

Figure 4:
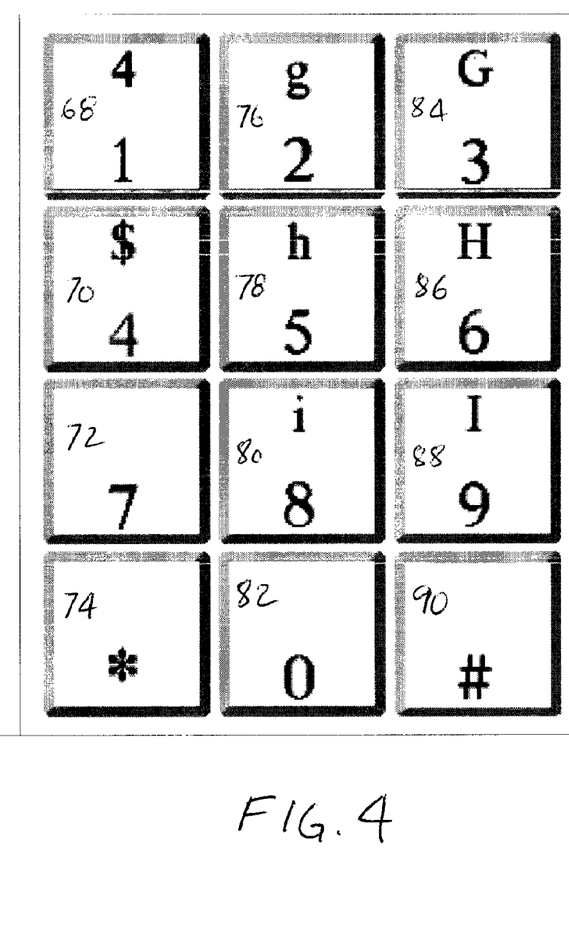
FIG. 4 illustrates an exemplary new keymapping of the keypad of FIG. 1 upon pressing the '4' key in accordance with the instant data entry system.

FIG. 4 illustrates the exemplary keypad mapping system when '4' is pressed on the keypad. In the first column, the first row 68 of the keypad is mapped to number 4. The second row 70 is mapped with the symbol associated with shifted number 4, which is the '$' symbol. The third row 72 key operates as a no-action or null key or may have a symbol associated with it, depending on the user or manufacturer's preference. The fourth row 74 maps to the * symbol.

The second column includes the lower case form of the letters associated with the letters corresponding to the keypad number, which in this example includes the letters g, h and i. For example, the first row 76 of the column is mapped with lower case 'g'. The second row 78 is mapped to lower case 'h' and the third row 80 is mapped to lower case 'i'. The fourth row 82 is mapped to any letter or symbol or left as a no-action or null key.

The third column includes the upper case letters associated with the letters corresponding to the keypad number, which includes the letters G, H and I. Thus, the first row 84 of the column is mapped with the upper case letter 'G'. The second row 86 is mapped to upper case 'H' and the third row 88 is mapped to upper case 'I'. The fourth row 90, once again, is mapped to any letter or symbol, or is left as a no-action or null key.

Figure 5:
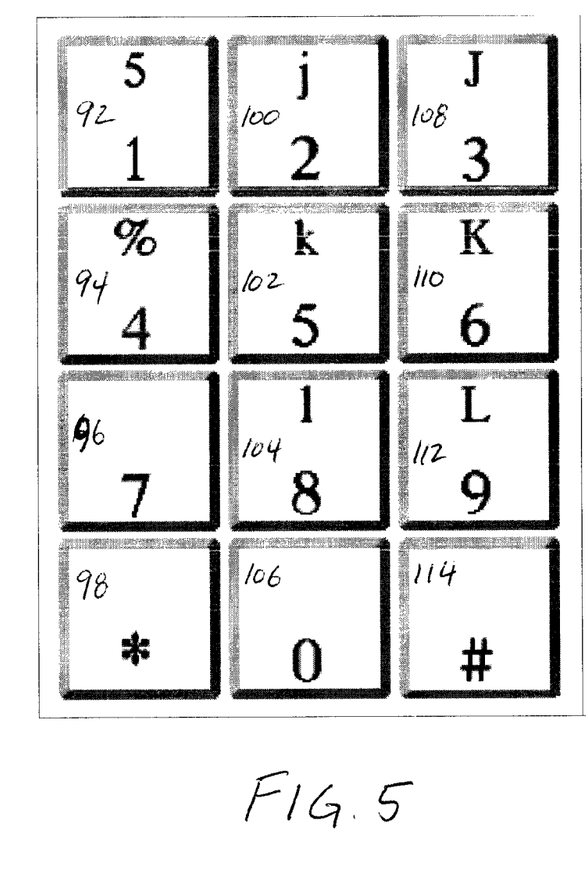
FIG. 5 illustrates an exemplary new keymapping of the keypad of FIG. 1 upon pressing the '5' key in accordance with the instant data entry system.

FIG. 5 shows the exemplary keypad mapping system where the user presses '5' on the keypad. In the first column, the first row 92 of the keypad is mapped to the number 5 itself. The second row 94 is mapped to '%', which is the symbol associated with shifted number 5. The third row 96 key remains blank as described above in relation to the previous key presses and the fourth row 98 is mapped to the * symbol.

The second column includes the lower case form of the letters associated with the letters corresponding to the keypad number, which includes the letters j, k and l. So, the first row 100 of the column is mapped with lower case 'j', the second row 102 is mapped to lower case 'k' and the third row 104 is mapped to lower case 'l'. The fourth row 106 is again the same as described above, The third column includes the upper case version of the above letters, which includes J, K and L. Therefore, the first row 108 of the column is mapped with the upper case letter 'J'. The second row 110 is mapped to upper case 'K' and the third row 112 is mapped to upper case 'L'. The fourth row 114, as usual, is mapped to any letter or symbol or left as a no-action or null key.

Figure 6:
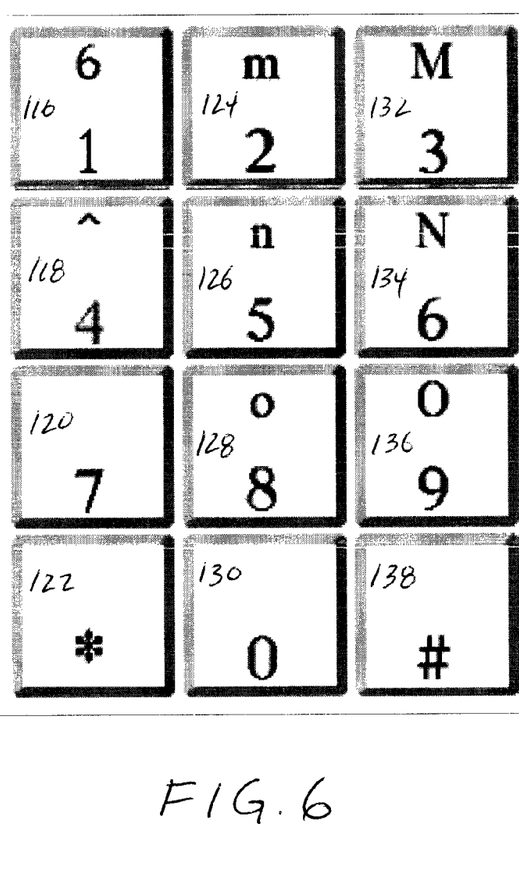
FIG. 6 illustrates an exemplary new keymapping of the keypad of FIG. 1 upon pressing the '6' key in accordance with the instant data entry system.

FIG. 6 illustrates the exemplary keypad mapping system when '6' is pressed. In the first column, the first row 116 of the keypad is mapped to number 6. The second row 118 is mapped with the symbol associated with shifted number 6, which is the '^' symbol. The third row 120 key again remains blank. The fourth row 122 includes the * symbol.

The second column includes the lower case form of the letters associated with the letters corresponding to the keypad number, which in this example includes the letters m, n and o. For example, the first row 124 of the column is mapped with the lower case 'm'. The second row 126 is mapped to lower case 'n' and the third row 128 is mapped to lower case 'o'. The fourth row 130 is mapped as usual.

The third column includes the upper case letters associated with the letters corresponding to the keypad number, which includes the letters M, N and O. Accordingly, the first row 132 of the column is mapped with the upper case letter 'M'. The second row 134 is mapped to upper case 'N' and the third row 136 is mapped to upper case 'O'. The fourth row 138, once again, is mapped as usual.

Figure 7:
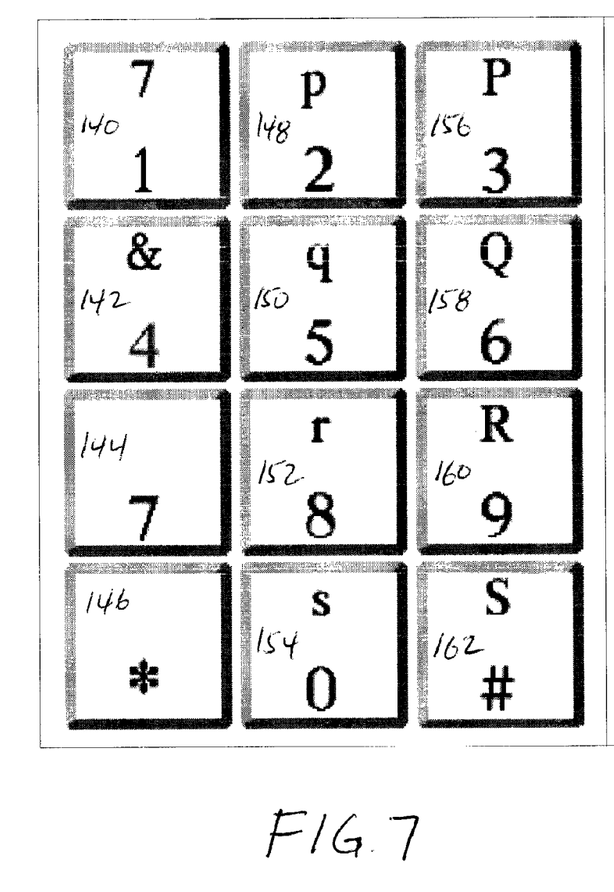
FIG. 7 illustrates an exemplary new keymapping of the keypad of FIG. 1 upon pressing the '7' key in accordance with the instant data entry system.

Turning now to FIG. 7, an exemplary keypad mapping system is illustrated for when a user presses '7' on the keypad. In the first column, the first row 140 of the keypad is mapped to the number 7. The second row 142 is mapped with the symbol associated with the shifted number 2, which is the '&' symbol. The third row 144 key remains blank and operates as a no-action or null key or it may be reserved for an additional symbol. The fourth and final row 146 includes the * symbol for aborting the operation and returning to the last state.

The second column includes the lower case form of the letters associated with the letters corresponding to the keypad number, which in this example includes the letters p, q, r and s. For example, the first row 148 of the column is mapped with the lower case letter 'p'. The second row 150 is mapped to lower case 'q', the third row 152 is mapped to lower case 'r' and the fourth row 154 is mapped to lower case 's'. A blank or null key is not used in this instance because the 7 key represents four letters, rather than the three letters of the previously described keys.

The third column includes the upper case letters associated with the letters corresponding to the keypad number, which includes the letters P, Q, R and S. Accordingly, the first row 156 of the column is mapped with the upper case letter 'P'. The second row 158 is mapped to upper case 'Q', the third row 160 is mapped to upper case 'R' and the fourth row 162 is mapped to upper case 'S'.

Figure 8:
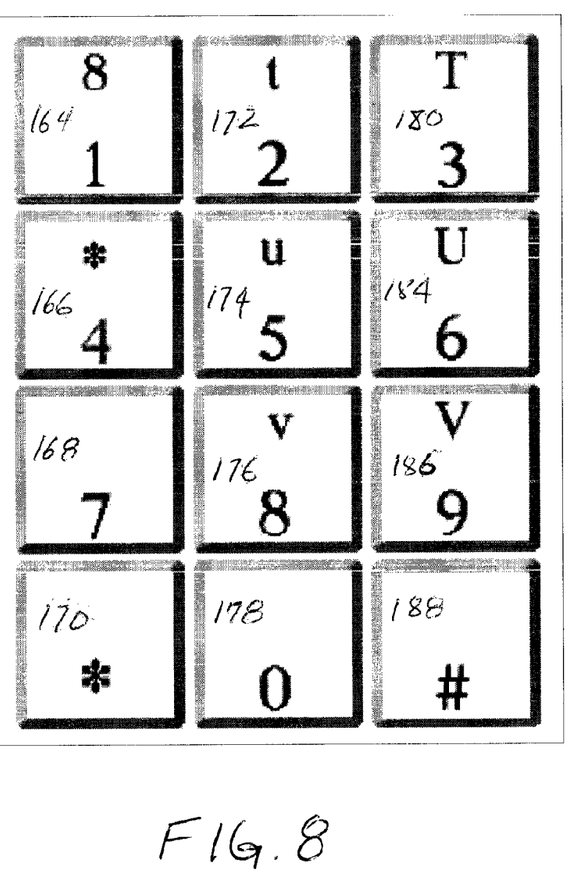
FIG. 8 illustrates an exemplary new keymapping of the keypad of FIG. 1 upon pressing the '8' key in accordance with the instant data entry system.

FIG. 8 illustrates the exemplary keypad mapping system when '8' is pressed on the keypad. In the first column, the first row 164 of the keypad is mapped to number 8. The second row 166 is mapped with the symbol associated with shifted number 8, which is the '*' symbol. The third row key 168 operates as a no-action or null key or may have a symbol associated with it, depending on the user or manufacturer's preference. The fourth row 170 maps to the * symbol once again.

The second column includes the lower case form of the letters associated with the letters corresponding to the keypad number, which in this example includes the letters t, u and v. For example, the first row 172 of the column is mapped with lower case 't'. The second row 174 is mapped to lower case 'u' and the third row 176 is mapped to lower case 'v'. The fourth row 178 is mapped to any letter or symbol or left as a no-action or null key.

The third column includes the upper case letters associated with the letters corresponding to the keypad number, which includes the letters T, U and V. Thus, the first row 180 of the column is mapped with the upper case letter 'T'. The second row 184 is mapped to upper case 'U' and the third row 186 is mapped to upper case 'V'. The fourth row 188, once again, is mapped to any letter or symbol, or is left as a no-action or null key.

Figure 9:
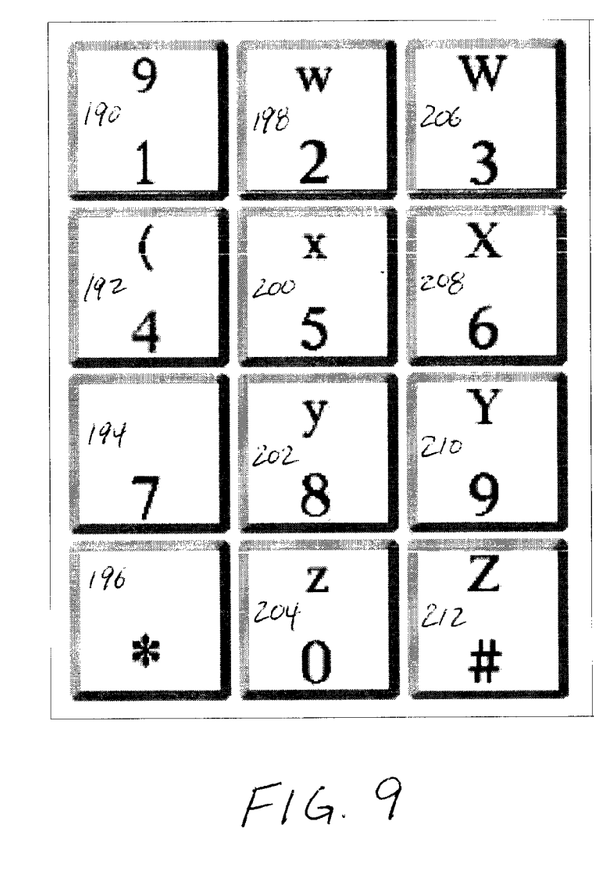
FIG. 9 illustrates an exemplary new keymapping of the keypad of FIG. 1 upon pressing the '9' key in accordance with the instant data entry system.

FIG. 9 shows the exemplary keypad mapping system where the user presses '9' on the keypad. In the first column, the first row 190 of the keypad is mapped to the number 9 itself. The second row 192 is mapped to '(', which is the symbol associated with shifted number 9. The third row key 194 remains blank as described above in relation to the previous key presses and the fourth row 196 is mapped to the * symbol.

The second column includes the lower case form of the letters associated with the letters corresponding to the keypad number, which includes the letters w, x, y and z. So, the first row 198 of the column is mapped with lower case 'w', the second row 200 is mapped to lower case 'x', the third row 202 is mapped to lower case 'y' and the fourth row 204 is mapped to lower case 'z'.

The third column includes the upper case version of the above letters, which includes W, X, Y and Z. Therefore, the first row 206 of the column is mapped with the upper case letter 'W'. The second row 208 is mapped to upper case 'X' and the third row 210 is mapped to upper case 'Y'. The fourth and last row 212 is mapped to the upper case letter 'Z'.

Figure 10:
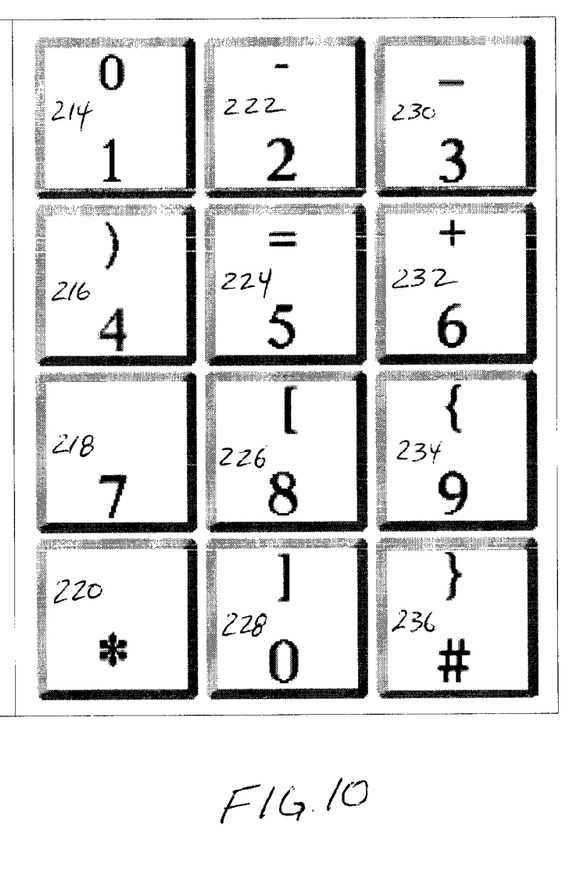
FIG. 10 illustrates an exemplary new keymapping of the keypad of FIG. 1 upon pressing the '0' key in accordance with the instant data entry system.

FIG. 10 illustrates the exemplary keypad mapping system when '0' is pressed. Similar to what was described above, the first row 214 of the first column is mapped to the number selected. The second row 216 is mapped to the shifted number 0, which is the ')' symbol. The third row 218 of the first column is mapped to the '''' symbol. The fourth row 220 is mapped to the * symbol.

The second column includes symbols found typically on standard typewriter and computer type keyboards. The first through fourth rows, 222, 224, 226, 228 are mapped to the '-', '=', '[' and ']' respectively.

The third column once again includes the shifted version of the symbols in column 2. In particular, the rows of the third column 230, 232, 234, 236 include the symbols '_', '+', '{' and '}'.

Although a particular sequence of symbols is shown, any arrangement may be used. However, the fourth row 220 includes the * symbol once again to ensure the ability to return to the previous screen or to execute a different function, as desired by the user. In an alternate embodiment (not shown), the '0' key is programmed such that a double press of the key acts as a space character. This may be considered a more intuitive use of the '0' key.

Figure 11:
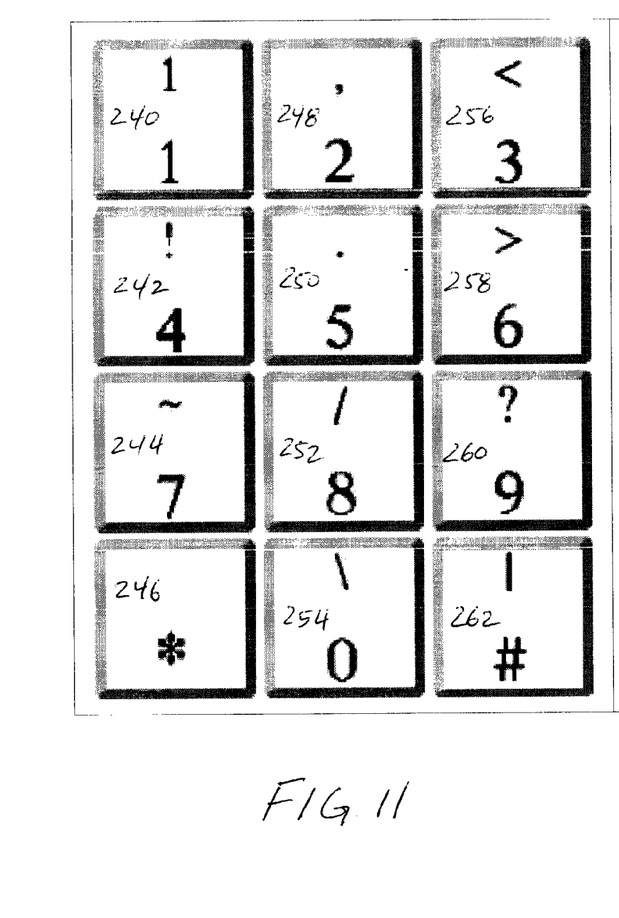
FIG. 11 illustrates an exemplary new keymapping of the keypad of FIG. 1 upon pressing the '1' key in accordance with the instant data entry system.

FIG. 11 shows the exemplary keypad mapping system when '1' is pressed. Because the number 1 is not associated with any alphabetic characters, it may conveniently be used to provide an array of additional symbol choices, as described in FIG. 10. For example, the first row 240 of the first column is mapped to the selected number 1. The second row 242 is mapped to the shifted number 1, which is the '!' symbol. The third row 244 of the first column is mapped to the '~' symbol. The fourth row 246 is mapped to the * symbol.

The second column includes symbols found typically on standard typewriter and computer type keyboards. The first through fourth rows, 248, 250, 252, 254 are mapped to the ',', '.', '/' and '\' respectively.

The third column once again includes the shifted version of the symbols in column 2. In particular, the rows of the third column 256, 258, 260, 262 include the symbols '<', '>', '?' and '|'.

Figure 12:
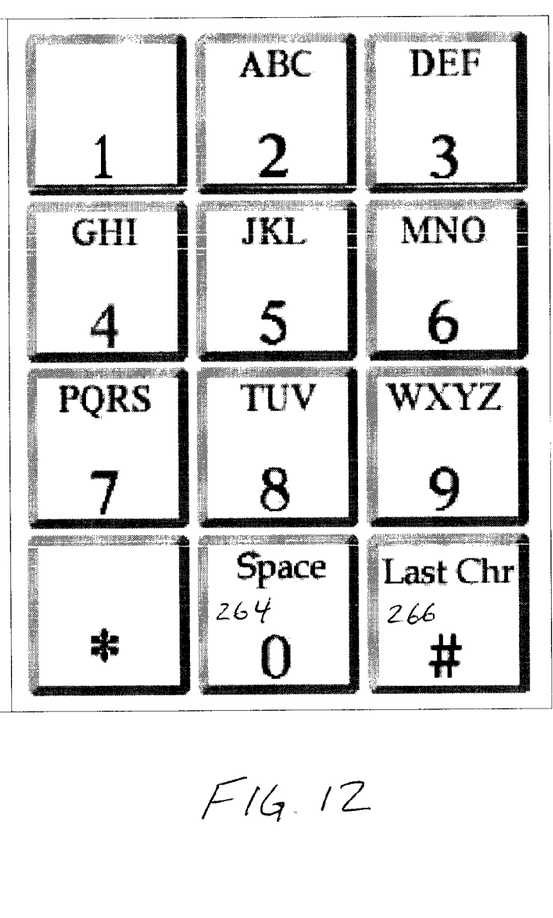
FIG. 12 illustrates an exemplary new keymapping of the keypad of FIG. 1 upon pressing the '#' key in accordance with the instant data entry system.

FIG. 12 is an illustration of the exemplary keypad mapping system when the '#' is pressed. Although not shown, additional symbols may be mapped to the various numeric keys. In this example, a space character 264 is mapped to 0 and pressing the '#' key 266 repeats the previous character that was entered.

The present data entry method and system is implemented in a variety of ways, depending on the nature of the technology being used. For example, in most standard cellular telephone handsets, the keypads include keys that are marked with the number as well as the letters associated with the number. Typically, a backlight illuminates the numbers and the letters for easy visual identification of the different keys, but the key labels cannot change according to function. In such cases, the present data entry system relies on the user learning the system through repeated use.

In another implementation, the system may be used in a touch screen environment. In that case, the screen may be programmed to change from numbers to symbols and/or letters as described above. In such instances, learning is not required. But, because the present data entry system is very intuitive, the user will likely be trained quickly enough so as to eliminate the need for visual verification of what is being typed into the keypad.

It is of note that in the above examples that not every key-press results in a remapped keypad where each key has a particular letter, symbol or number associated with that key. In such instances, the "empty" spots may be filled with additional characters or symbols as needed. Optionally, the empty spots may be used as a function key to enable another remapping of the keypad or to execute one or more functions or macros (a defined set of several specific key presses). As can be seen, the present system and method for data entry provides a versatile and flexible means for easily entering text into communications and electronics devices.

Also it is to be noted that although the asterisk symbol has been described as aborting the present operation and returning to the previous state, it may instead be used as a function key for executing any preprogrammed function. Or, it may be used as a programmable function that may be selected by the user or system configurator. In fact, this is possible with virtually the entire keypad.

It should be understood that the implementation of other variations and modifications of The present system and method in its various aspects will be apparent to those of ordinary skill in The art, and that the invention is not limited by the specific embodiments described.

It is therefore contemplated to cover by the present invention, any and all modifications, variations, or equivalents that fall within the spirit and scope of the basic underlying principles disclosed and claimed herein, including among other things, virtual or onscreen representation of the keyboard device, virtual or onscreen display of the key presses being entered by a user or the display, and virtual or on screen navigation of the presently described data entry system.

What is claimed is:

1. A data entry system comprising:
a keypad for entering data into the data entry system, wherein the keypad is configured as a keypad having three columns of four rows each;
the first row having three keys representing the numbers one, two and three, the second row having three keys representing the numbers four, five and six, the third row having three keys representing the numbers seven, eight and nine, and the fourth row having at least one key, wherein the at least one key represents the number zero;
wherein the number two key represents the letters A, B and C, the number three key represents the letters D, E and F, the number four key represents the letters J, K and L, the number six key represents the letters M, N and O, the number seven key represents the letters P, Q, R and S, the number eight key represents the letters T, U and V, and the number nine key represents the letter W, X, Y and Z; and
a mapping scheme for mapping the letters of the keypad in a predetermined order when a first key is pressed, wherein the first column includes the value of the number pressed, the second column includes each of the letters representing the number pressed and the third column includes the shifted versions of each of the letters representing the number pressed.

2. The data entry system of claim 1, wherein the first column includes symbols.

3. The data entry system of claim 1, wherein the first, second and third columns may be interchanged.

4. The data entry system of claim 1, wherein the second column displays lower case letters.

5. The data entry system of claim 1, wherein the third column displays upper case letters.

6. The data entry system of claim 1, wherein pressing a first predetermined key aborts the current operation.

7. The data entry system of claim 1, wherein pressing a second predetermined key twice in succession repeats entry of the previously entered character.

8. The data entry system of claim 1, wherein pressing a third predetermined key twice in succession enters a space.

9. A method for entering data into an electronic device, comprising:
entering data into the data entry system using a keypad, wherein the keypad is configured as a group of keys having three columns of four rows each;
the first row having three keys representing the numbers one, two and three, the second row having three keys representing the numbers four, five and six, the third row having three keys representing the numbers seven, eight and nine, and the fourth row having three keys representing the asterisk, zero and pound sign;
wherein the number two key represents the letters A, B and C, the number three key represents the letters D, E and F, the number four key represents the letters J, K and L, the number six key represents the letters M, N and O, the number seven key represents the letters P, Q, R and S, the number eight key represents the letters T, U and V, and the number nine key represents the letters W, X, Y and Z; and mapping the letters of the keypad in a predetermined order when a first key is pressed, wherein the first column includes the value of the number pressed, the second column includes each of the letters representing the number pressed and the third column includes the shifted versions of each of the letters representing the number pressed.

10. The data entry method of claim 9, further comprising the step of assigning the first column one or more symbols.

11. The data entry method of 9, further comprising the step of interchanging the first, second and third columns.

12. The data entry method of claim 9, further comprising the step of displaying lower case letters in the second column.

13. The data entry system of claim 9, wherein the third column displays upper case letters.

14. The data entry system of claim 9, wherein pressing a first predetermined key aborts the current operation.

15. The data entry system of claim 9, wherein pressing a second predetermined key twice repeats entry of the previously entered character.

16. The data entry system of claim 9, wherein pressing a third predetermined key twice enters a space character.

17. The data entry system of claim 1, wherein the keypad is a virtual keypad.

18. The data entry system of claim 1, wherein the keypad is displayed on a screen.

19. The data entry system of claim 17, wherein user interaction with the keypad is displayed virtually.

20. The data entry system of claim 18, wherein user interaction with the keypad is displayed on the screen.

* * * * *